(12) United States Patent
Morishita et al.

(10) Patent No.: US 8,569,890 B2
(45) Date of Patent: Oct. 29, 2013

(54) POWER SEMICONDUCTOR DEVICE MODULE

(75) Inventors: Kazuhiro Morishita, Tokyo (JP); Masuo Koga, Fukuoka (JP); Yukimasa Hayashida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/531,843

(22) Filed: Jun. 25, 2012

(65) Prior Publication Data
US 2013/0249100 A1 Sep. 26, 2013

(30) Foreign Application Priority Data
Mar. 22, 2012 (JP) ................. 2012-064757

(51) Int. Cl.
*H01L 23/48* (2006.01)
(52) U.S. Cl.
USPC ........................................... 257/772
(58) Field of Classification Search
USPC ........................................... 257/772
See application file for complete search history.

(56) References Cited

U.S. PATENT DOCUMENTS 4,546,028 A 10/1985 Val

FOREIGN PATENT DOCUMENTS

| JP | 53-81957 | 7/1978 |
| JP | 58-197866 | 11/1983 |
| JP | 62-37951 | 2/1987 |
| JP | 2003-218293 | 7/2003 |
| JP | 2006-344841 | 12/2006 |

*Primary Examiner* — Anthony Ho
(74) *Attorney, Agent, or Firm* — Oblon, Spivak, McClelland, Maier & Neustadt, L.L.P.

(57) ABSTRACT

A power semiconductor device module includes: a base plate; an insulating substrate mounted on the base plate; and a diode chip mounted on the insulating substrate, wherein the insulating substrate has an upper surface electrode layer disposed on an upper main surface and a lower surface electrode layer disposed on a lower main surface, the diode chip is joined onto the upper surface electrode layer, the lower surface electrode layer is joined onto the upper main surface of the base plate, and a thermal resistance reducing section that reduces thermal resistance is provided in lower surface electrode layer or the base plate of a portion corresponding to a place immediately below the diode chip.

19 Claims, 7 Drawing Sheets

POWER SEMICONDUCTOR DEVICE MODULE

BACKGROUND OF THE INVENTION

1. Field of the Invention

The present invention relates to a power semiconductor device module, and particularly relates to a power semiconductor device module for use in a power converter that controls electric equipment such as a motor.

2. Description of the Background Art

In a conventional power semiconductor device module, especially in a power semiconductor device module for use in applications required to have high reliability, such as a power semiconductor device module for use in railways, for example, as disclosed in Japanese Patent Application Laid-Open No. 2006-344841, a configuration has been adopted in which an insulating substrate with an electrode layer provided on each surface thereof is bonded by soldering onto a base plate made of copper or the like, and a semiconductor chip such as an IGBT (Insulated Gate Bipolar Transistor) or a free wheel diode is joined by soldering onto the insulating substrate.

In the power semiconductor device module with such a configuration, any of the base plate, the insulating substrate, the electrode layer on the insulating substrate, and a solder thickness is set to a uniform thickness, and the module is configured to make thermal resistance equal.

Recently, as a semiconductor substrate in place of a silicon substrate, there has been developed a semiconductor device by means of a semiconductor substrate having a wide band gap such as a semiconductor substrate formed of a silicon carbide (SiC)-based material, a gallium nitride-based material, or a diamond.

For example, a silicon carbide semiconductor device can be operated with a current density thereof increased from that of the conventional silicon semiconductor device. However, there has been a problem in that, when a semiconductor chip (SiC semiconductor chip) made up of the silicon carbide silicon device is mounted in a package with a conventional structure, a temperature rise due to heat generation of the semiconductor chip cannot be suppressed unless a configuration is adopted in which the thermal resistance is decreased in accordance with an increase in current density, thus shortening a product life.

SUMMARY OF THE INVENTION

There is provided a power semiconductor device module capable of preventing a temperature rise due to heat generation of a semiconductor chip even in the case of mounting a semiconductor chip including a semiconductor device having a wide band gap such as a SiC semiconductor chip.

An aspect of a power semiconductor device module according to the present invention is a power semiconductor device module, which includes a base plate, an insulating substrate mounted on the base plate, and a power semiconductor device mounted on the insulating substrate, and is obtained by modularizing the base plate, the insulating substrate, and the power semiconductor device, wherein the insulating substrate has a first electrode layer disposed on a first main surface and a second electrode layer disposed on a second main surface, the power semiconductor device is joined onto the first electrode layer, the second electrode layer is joined onto a first main surface of the base plate, and a thermal resistance reducing section that reduces thermal resistance is provided in the second electrode layer or the base plate of a portion corresponding to a place immediately below the power semiconductor device.

According to the above power semiconductor device module, since the thermal resistance reducing section that reduces thermal resistance is provided in the second electrode layer or the base plate of the portion corresponding to the place immediately below the power semiconductor device, a heat dissipation effect is enhanced, thereby to allow suppression of a temperature rise due to heat generation at the time of operation of the power semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

<Configuration of Device>

A first preferred embodiment of a power semiconductor device module according to the present invention will be described with reference to FIG. 1 and FIG. 2.

Figure 1:
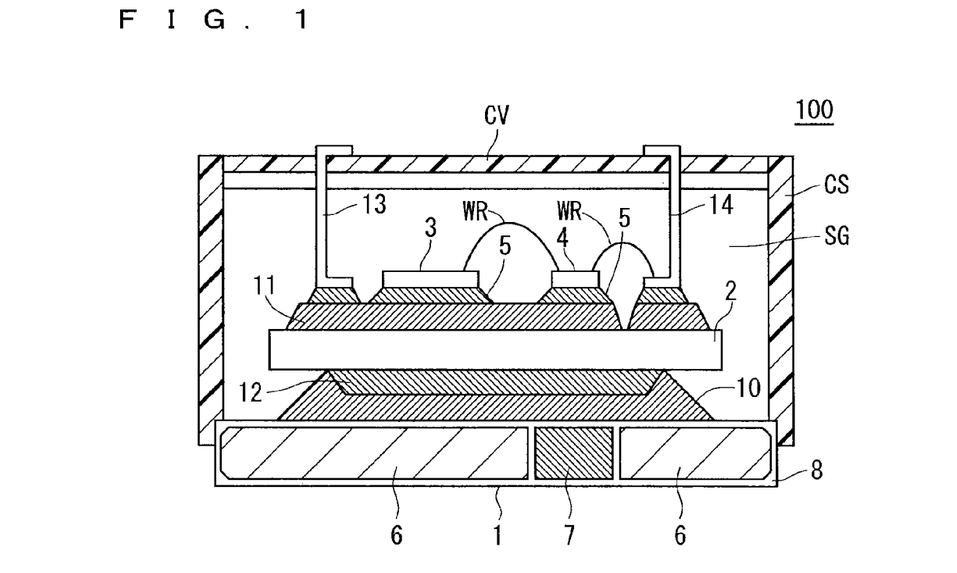
FIG. 1 is a sectional view showing a configuration of a power semiconductor device module in a first preferred embodiment according to the present invention.

FIG. 1 is a sectional view showing a configuration of a power semiconductor device module 100 in the first preferred embodiment. As shown in FIG. 1, the power semiconductor device module 100 has a configuration in which an IGBT (Insulated Gate Bipolar Transistor) chip 3 and a diode chip 4 are joined onto an upper surface electrode layer 11 provided on an upper main surface of an insulating substrate 2 via a solder layer 5, and the insulating substrate 2 has a configuration in which a lower surface electrode layer 12 provided on a lower main surface thereof is joined to an upper main surface of a base plate 1 via a solder layer 10. It is to be noted that at least one of the IGBT chip 3 and the diode chip 4 is a SiC semiconductor chip, and FIG. 1 shows the case where the diode chip 4 is the SiC semiconductor chip.

The insulating substrate 2 is a substrate having insulating properties which is made of any of AlN (aluminum nitride), $Al_2O_3$ (alumina), and $Si_2N_3$. The upper surface electrode layer 11 on the insulating substrate 2 has a pattern electrically separated between an area mounted with IGBT chip 3 and the diode chip 4 and an area mounted with the terminal plates 13 and 14, and the terminal plates 13 and 14 are also connected to the mutually electrically separated areas of the upper surface electrode layer 11.

Aluminum wires WR, for example, electrically connect between an upper surface electrode of the IGBT chip 3 and an upper surface electrode of the diode chip 4 and between the upper surface electrode of the diode chip 4 and the terminal plate 14, and the electrode layer 11 electrically connects between a lower surface electrode of the IGBT chip 3 and a lower surface electrode of the diode chip 4.

For example, when the IGBT chip 3 is a switching device constituting an inverter, it is configured that the diode chip 4 is connected to the IGBT chip 3 in series in a circulating direction of a forward current so as to function as a free wheel diode, an emitter of the IGBT chip 3 and an anode of the diode chip 4 are electrically connected to the terminal plate 14 via the wire WR, and a collector of the IGBT chip 3 and a cathode of the diode chip 4 are electrically connected to the terminal plate 13 via the upper surface electrode layer 11. In addition, a gate of the IGBT chip 3 is connected to the gate terminal plate via the wire, but illustration thereof is omitted.

The upper main surface side of the base plate 1 where the insulating substrate 2 is mounted is surrounded by a case CS, and the top of the case CS is covered by a lid CV. A silicone gel SG is put into an area defined by the base plate 1, the case CS, and the lid CV, and the IGBT chip 3 and the like are sealed together with the insulating substrate 2.

The base plate 1 is formed of a metal matrix composite made of aluminum and ceramic, such as Al—SiC (aluminum silicon carbide).

Al—SiC is obtained by impregnating with aluminum a SiC porous molded body (SiC preform) 6 obtained by molding SiC powder with a binder. Although it is illustrated in FIG. 1 that the surface of the SiC preform 6 is covered by aluminum 8, it is actually configured such that the porous structure of the SiC preform 6 is impregnated with the aluminum 8.

The base plate 1 shown in FIG. 1 has a configuration in which a thermal conduction block 7 formed of a metal material, such as aluminum or copper, having a higher thermal conductivity than that of the SiC preform 6 is embedded in a position corresponding to the place immediately below the diode chip 4 mounted on the insulating substrate 2.

For this reason, thermal resistance of the portion corresponding to the place immediately below the diode chip 4 is reduced as compared with a configuration without the thermal conduction block 7. The thermal conduction block 7 having such a function is referred to as a thermal resistance reducing section.

Then, heat generated in the diode chip 4 is transmitted to the thermal conduction block 7 via the upper surface electrode layer 11, the insulating substrate 2, the lower surface electrode layer 12, and the solder layer 10 in a vertical direction of the substrate, and is discharged outside via the thermal conduction block 7 having a high thermal conductivity.

In the power semiconductor device module 100 as thus configured, the heat dissipation effect of heat generated at the time of operation of the diode chip 4 is enhanced, whereby it is possible to reduce thermal stress, generated due to the temperature change, on each component inside the module, while preventing a temperature rise, so as to suppress shortening of a product life.

<Manufacturing Method>

Next, a manufacturing method for the base plate 1 will be described with reference to FIG. 2 and FIG. 3. Although the base plate 1 is obtained by impregnating the SiC preform 6 with aluminum as described above, a description thereof will be omitted since known techniques can be used as a manufacturing method for the SiC preform 6 and an impregnation method with aluminum.

Figure 2:
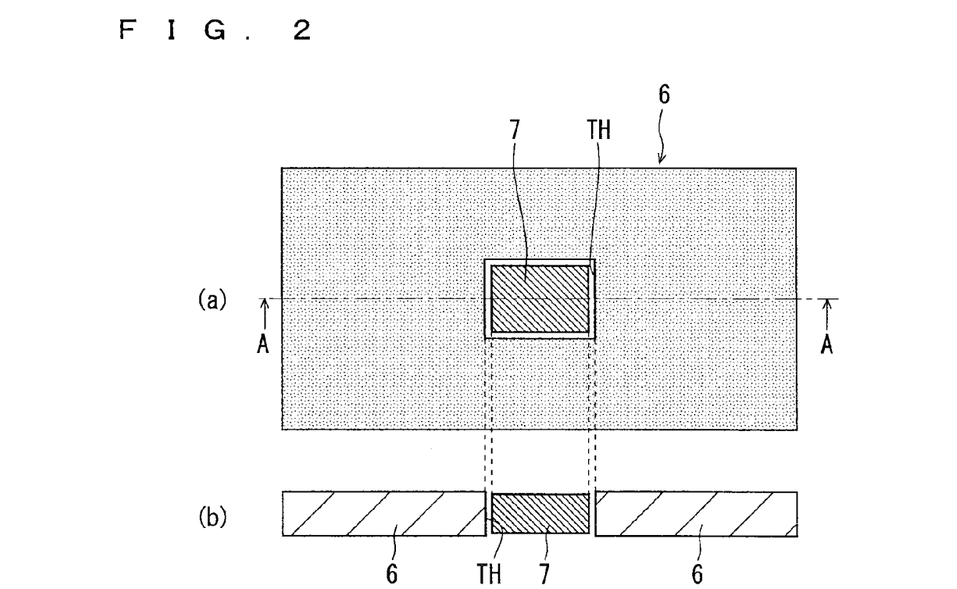
FIG. 2 and FIG. 3 are views describing a manufacturing method for a base plate of the power semiconductor device module in the first preferred embodiment according to the present invention.
Figure 3:
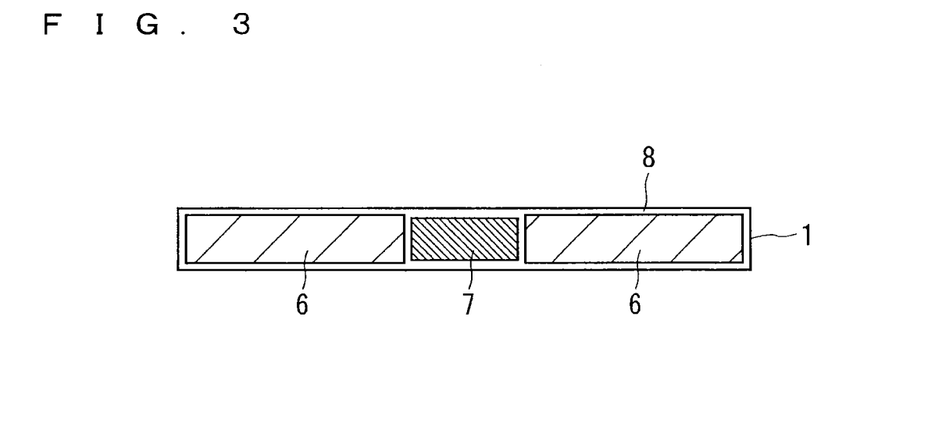

FIG. 2 schematically shows the manufacturing method for the base plate 1, where part (a) of FIG. 2 shows a plan view and part (b) of FIG. 2 shows a sectional view along line A-A in the plan view.

First, as shown in part (a) of FIG. 2, the SiC preform 6 is prepared in which a portion embedded with the thermal conduction block 7 serves as a through hole TH. Then, a metal block constituting the thermal conduction block 7 is inserted into the through hole TH.

It is to be noted that, since a thickness of the thermal conduction block 7 is almost the same as a thickness of the SiC preform 6 and a metal block is also covered by an aluminum layer by the aluminum impregnating operation, a height of the metal block is set considering the thickness of the aluminum layer. Thereby, one end surface of the thermal conduction block 7 is the same plane as the upper main surface of the base plate 1, and the other end surface of the thermal conduction block 7 is the same plane as the lower main surface of the base plate 1. It is to be noted that, when the end surfaces are not the same planes as the upper and lower main surface of the base plate 1, the end surfaces may be planarized by polishing the upper and lower main surfaces of the base plate 1.

Herein, a plane shape of the through hole TH is a rectangular shape conformed to a plane shape of the diode chip 4. However, the shape is not limited to the rectangular shape, and may be a circular shape or an elliptical shape. Further, a plane size thereof is formed to be the same level as or larger than the plane size of the diode chip 4.

Moreover, the through hole TH and the thermal conduction block 7 are designed with such a size tolerance as to form a gap to the extent that aluminum can enter between the through hole TH and the thermal conduction block 7 in the aluminum impregnating operation, while the thermal conduction block 7 is insertable into the through hole TH.

Since the aluminum impregnation is performed in the state where the thermal conduction block 7 is inserted in the through hole TH, aluminum enters between the through hole TH and the thermal conduction block 7, and a porous structure of the SiC preform 6 is impregnated with aluminum, to form a structure in which the thermal conduction block 7 is embedded into the base plate 1.

Further, although the example was described above where the base plate 1 is formed of the metal matrix composite made of aluminum and ceramic such as Al—SiC, the material for the base plate 1 is not limited thereto, and the present invention is also effective to the case where the material is made of, for example, alumina ceramic, and the like.

Second Preferred Embodiment

Figure 4:
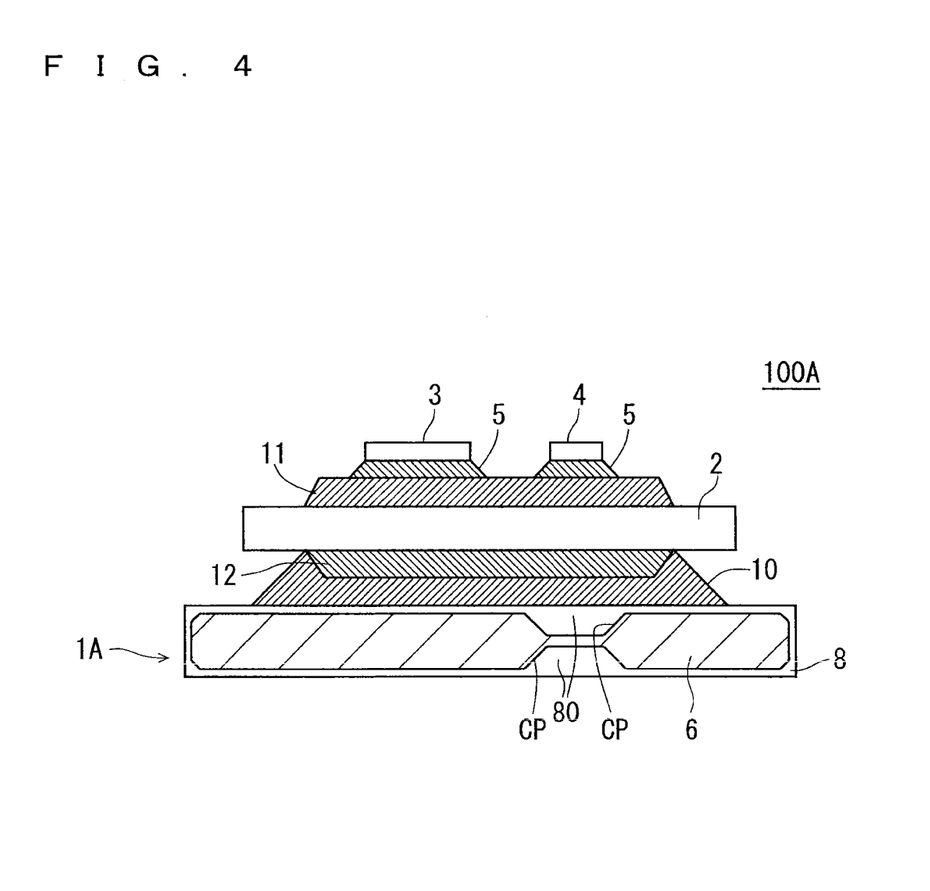
FIG. 4 is a sectional view showing a configuration of a power semiconductor device module in a second preferred embodiment according to the present invention.

A second preferred embodiment of the power semiconductor device module according to the present invention will be described with reference to FIG. 4. FIG. 4 is a sectional view showing a configuration of a power semiconductor device module 100A in the second preferred embodiment. It is to be noted that the same configuration as the power semiconductor device module 100 shown in FIG. 1 is provided with the same reference numeral, and a description thereof will not be repeated. Further, in FIG. 4, only a base plate 1A and the insulating substrate 2 are shown, and illustration of a configuration of the case CS and the like which are not closely related to the invention will be omitted.

The base plate 1A is formed of the metal matrix composite made of aluminum and ceramic, such as Al—SiC, and a concave section CP is provided on each of the upper and lower main surfaces of the SiC preform 6 in a position corresponding to a place immediately below the diode chip 4 mounted on the insulating substrate 2. Thus, the SiC preform 6 of the above portion is locally thin, and the concave section CP is filled with an aluminum layer 80.

The concave section CP is filled with aluminum when the SiC preform 6 is impregnated with aluminum in a manufacturing step for the base plate 1A, thereby to form the aluminum layer 80.

It should be noted that providing the concave sections CP on the upper main surface side and the lower main surface side leads to an advantage that a depth of each concave section CP can be made small and only a short period of time is required for filling of aluminum as compared with the case of providing the concave section CP only on one main surface side.

Since thermal resistance is reduced in the aluminum layer 80 as compared with the other portion of the base plate 1A, the aluminum layer 80 having such a function is referred to as a thermal resistance reducing section.

The heat generated in the diode chip 4 is transmitted to the aluminum layer 80 via the upper surface electrode layer 11, the insulating substrate 2, the lower surface electrode layer 12 and the solder layer 10 in a vertical direction of the substrate, and is discharged outside via the thinned SiC preform 6 and the lower main surface side of the aluminum layer 80.

In the power semiconductor device module 100A as thus configured, the heat dissipation effect of heat generated at the time of operation of the diode chip 4 is enhanced, whereby it is possible to reduce thermal stress, generated due to the temperature change, on each component inside the module, while preventing a temperature rise of the chip, so as to suppress shortening of a product life.

Further, the base plate 1A also has an advantage of not requiring a particular material such as the thermal conduction block 7 as compared with the base plate 1 in the first preferred embodiment, and being manufacturable by the same manufacturing method as the conventional method.

It should be noted that the SiC preform 6 in the position corresponding to the place immediately below the diode chip 4, for example, has a thickness on the order of being half as large as the thicknesses of the other portion. For example, when the thickness of the other portion is 5 mm, the thickness of the position corresponding to the place immediately below the diode chip 4 is about 2.5 mm, and the depth of the concave section CP is on the order of 1.25 mm. With the concave section CP fully filled with aluminum, the thickness of the aluminum layer 80 is the same level as the depth of the concave section CP.

Further, although the example was shown above where the concave sections CP on the upper main surface side and the lower main surface side of the base plate 1A are made to have the same depth, the concave section CP may be configured to have a larger depth on the upper main surface side and a smaller depth on the lower main surface side, or may be formed only on the upper main surface side.

Third Preferred Embodiment

Figure 5:
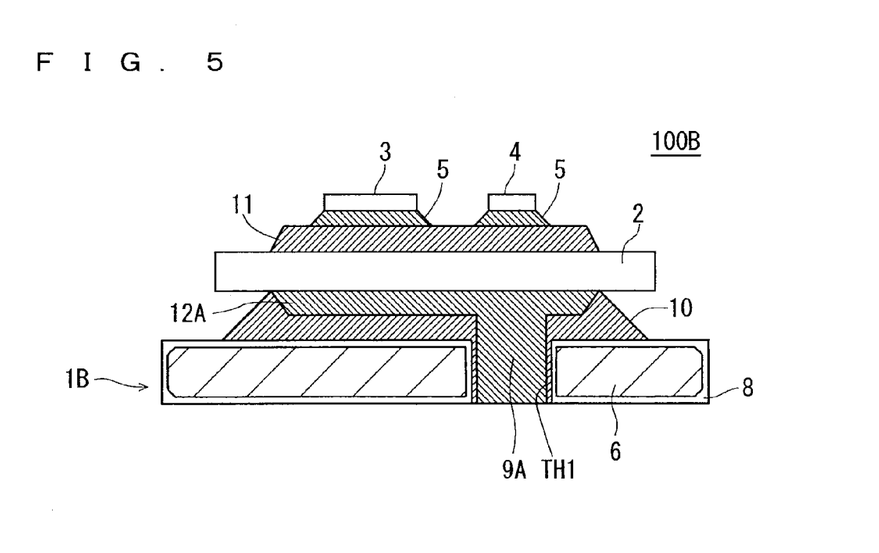
FIG. 5 is a sectional view showing a configuration of a power semiconductor device module in a third preferred embodiment according to the present invention.

A third preferred embodiment of the power semiconductor device module according to the present invention will be described with reference to FIG. 5. FIG. 5 is a sectional view showing a configuration of a power semiconductor device module 100B in the third preferred embodiment. It is to be noted that the same configuration as the power semiconductor device module 100 shown in FIG. 1 is provided with the same reference numeral, and a description thereof will not be repeated. Further, in FIG. 5, only a base plate 1B and the insulating substrate 2 are shown, and illustration of a configuration of the case CS and the like which are not closely related to the invention will be omitted.

The base plate 1B is formed of the metal matrix composite made of aluminum and ceramic, such as Al—SiC, and a through hole TH1 is provided in a position corresponding to a place immediately below the diode chip 4 mounted on the insulating substrate 2.

Further, the lower surface electrode layer 12A on the insulating substrate 2 has a projected section 9A in the position corresponding to the place immediately below the diode chip 4. The projected section 9A has a height being a sum of a thickness of the solder layer 10 and a thickness of the base plate 1B so that an end surface thereof forms the same plane as the lower main surface of the base plate 1B when the projected section 9A is inserted into the through hole TH1 of the base plate 1B.

Therefore, mounting the insulating substrate 2 on the base plate 1B such that the projected section 9A is inserted into the through hole TH1 of the base plate 1B and joining them by means of the solder layer 10 leads to elimination of a joint section formed by means of the solder layer 10 in the portion corresponding to the place immediately below the diode chip 4.

Since the lower surface electrode layer 12A is formed of a metal material such as aluminum and copper having a high thermal conductivity, thermal resistance can be reduced in the portion provided with the projected section 9A as compared with a portion joined via the solder layer 10. The projected section 9A having such a function is referred to as a thermal resistance reducing section.

Heat generated in the diode chip 4 is transmitted to the projected section 9A of the lower surface electrode layer 12 via the upper surface electrode layer 11 and the insulating substrate 2, in a vertical direction of the substrate, and is discharged outside via the projected section 9A having a high thermal conductivity. Herein, the end surface of the projected section 9A is exposed from the through hole TH1 on the lower main surface of the base plate 1B, since the lower main surface of the base plate 1B is mounted on a heat sink, the end surface of the projected section 9A exposed from the through hole TH1 comes into contact with the heat sink, to be cooled.

In the power semiconductor device module 100B as thus configured, it is possible to reduce thermal stress, generated due to the temperature change, on each component inside the module, while preventing a temperature rise of the chip at the time of operation of the diode chip 4, so as to suppress shortening of a product life.

Further, the power semiconductor device module 100B also has an advantage of facilitating positioning of the insulating substrate 2 with respect to the base plate 1B since the lower surface electrode layer 12A on the insulating substrate 2 has the projected section 9A.

Herein, a plane shape of the through hole TH1 provided in the base plate 1B may be a rectangular shape conformed to the plane shape of the diode chip 4, or may be a circular shape or an elliptical shape. Further, a plane size thereof is formed to be the same level as or larger than the plane size of the diode chip 4.

Moreover, as for the through hole TH1 and the projected section 9A of the lower surface electrode layer 12A on the insulating substrate 2, the projected section 9A is desirably insertable into the through hole TH1, and the through hole TH1 and the projected section 9A desirably adhere to each other so as to prevent solder from entering therebetween at the time of the joining operation by means of the solder layer 10.

However, when the size tolerance is set so as not to form a gap between the through hole TH1 and the projected section 9A, an operation of engagement therebetween may be difficult. For this reason, the size tolerance is set between the through hole TH1 and the projected section 9A so as to form a gap for allowing smooth engagement, and it is configured to prevent the solder from flowing out to the lower main surface side of the base plate 1B through the gap.

For example, the projected section 9A with the surface thereof applied with silicone rubber may be inserted into the through hole TH1, and bonded thereto with the silicone rubber. In this case, with the silicone rubber present between the through hole TH1 and the projected section 9A, it is possible to prevent the solder from flowing out to the lower main surface side of the base plate 1B.

Further, a configuration to prevent solder from flowing out may be provided in a jig used at the time of soldering. As an example of this configuration, a description thereof will be given with reference to FIG. 6.

Figure 6:
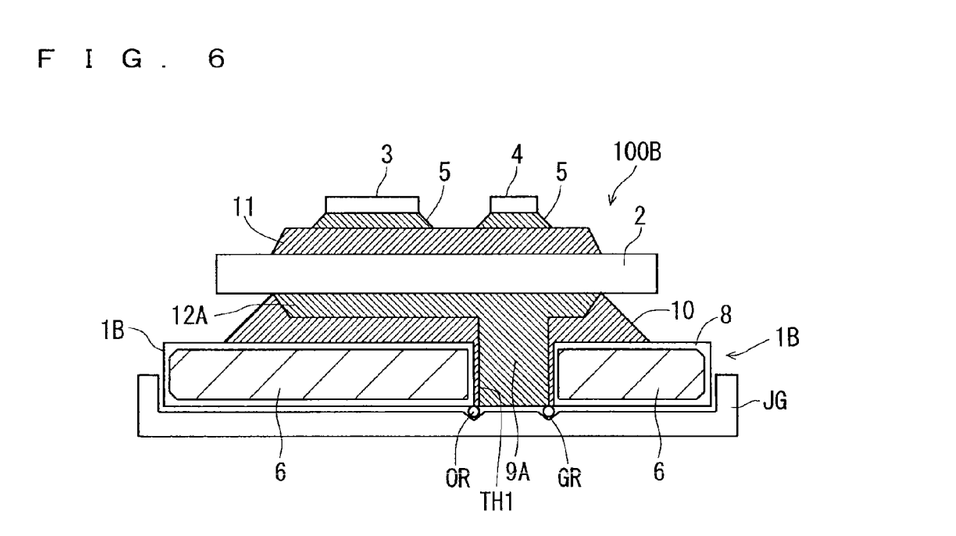
FIG. 6 is a view describing a manufacturing method for the power semiconductor device module in the third preferred embodiment according to the present invention.

FIG. 6 is a sectional view showing a state where the power semiconductor device module 100B is mounted in a jig JG at the time of soldering. As shown in FIG. 6, in the case of mounting the insulating substrate 2 on the base plate 1B and joining them by means of the solder layer 10, the base plate 1B is put into an open-bottom, closed-top jig JG having a box shape. Then, a solder member is arranged on the upper main surface side of the base plate 1B, and a base plate 1F in the jig JG is wholly heated to melt the solder member. At this time, the solder member is arranged so that the melted solder member does not to flow into the through hole TH1 of the base plate 1B.

Subsequently, the insulating substrate 2 is mounted on the base plate 1B such that the projected section 9A is inserted into the through hole TH1 of the base plate 1B, whereby the melted solder member expands between the lower surface electrode layer 12 on the insulating substrate 2 and the upper main surface of the base plate 1B, and the insulating substrate 2 is joined onto the base plate 1B.

Herein, a groove GR to be embedded with a gasket OR such as an O-ring is provided in a portion corresponding to an outer edge of the through hole TH1 of the base plate 1B in a bottom surface section of the jig JG, and the gasket OR is embedded thereinto. Providing this gasket OR in a position to close an outlet of the gap between the through hole TH1 and the projected section 9A can prevent the melted solder member from flowing out to the lower main surface side of the base plate 1B even when the melted solder member enters into the gap between the through hole TH1 and the projected section 9A.

Removing the base plate 1B from the jig JG after solidification of the solder member gives a configuration in which the insulating substrate 2 is joined onto the base plate 1B.

Further, although the example was described above where the base plate 1B is formed of the metal matrix composite made of aluminum and ceramic such as Al—SiC, the material for the base plate 1B is not limited thereto, and the present invention is also effective to the case where the material is made of, for example, alumina ceramic, and the like.

Modified Example

Figure 7:
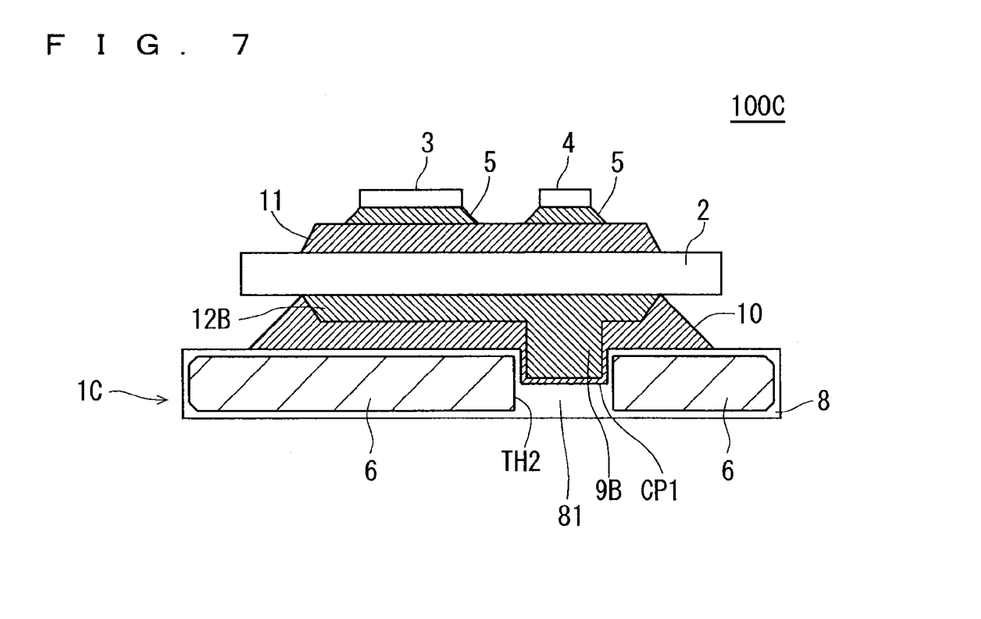
FIG. 7 is a sectional view showing a configuration of a modified example of the power semiconductor device module in the third preferred embodiment according to the present invention.

As described above, the power semiconductor device module 100B of the third preferred embodiment has the configuration in which the projected section 9A provided in the lower surface electrode layer 12A on the insulating substrate 2 is inserted into the through hole TH1 provided in the base plate 1B, and the end surface of the projected section 9A is exposed from the through hole TH1 on the lower main surface of the base plate 1B. However, the configuration as shown in FIG. 7 may also be adopted.

That is, in the power semiconductor device module 100C shown in FIG. 7, a concave section CP1 is provided in the position of a base plate 1C which corresponds to the place immediately below the diode chip 4 mounted on the insulating substrate 2, and a lower surface electrode layer 12B on the insulating substrate 2 is configured to have a projected section 9B in the position corresponding to the place immediately below the diode chip 4.

Then, the projected section 9B of the lower surface electrode layer 12B on the insulating substrate 2 is inserted into a concave section CP1 of the base plate 1C.

Herein, the projected section 9B has a thickness being a sum of a thickness of the solder layer 10 and a depth of the concave section CP1. It should be noted that the concave section CP1 has a depth reaching a half of a thickness of the base plate 1C.

Further, the concave section CP 1 is provided such that an aluminum layer 81, having been filled in the aluminum impregnating step, serves as a bottom surface section in a through hole TH2 which has been provided so as to penetrate the SiC preform 6 of the base plate 1C, and the bottom surface of the concave section CP1 serves as the surface of the aluminum layer 81. Therefore, the end surface of the projected section 9B inserted into the concave section CP1 comes into contact with the aluminum layer 81.

In the aluminum layer 81 provided in the base plate 1C as described above, thermal resistance is reduced as compared with the other portion of the base plate 1C. Therefore, the aluminum layer 81 having such a function is referred to as a thermal resistance reducing section.

Herein, a plane shape of the concave section CP1 provided in the base plate 1C may be a rectangular shape conformed to the plane shape of the diode chip 4, or may be a circular shape or an elliptical shape. Further, a plane size thereof is formed to be the same level as or larger than the plane size of the diode chip 4.

Mounting the insulating substrate 2 on the base plate 1C such that the projected section 9B is inserted into the concave section CP1 of the base plate 1C and joining them by means of the solder layer 10 leads to elimination of a joint section formed by means of the solder layer 10 in the portion corresponding to the place immediately below the diode chip 4.

Since the lower surface electrode layer 12B is formed of a metal material such as aluminum and copper having a high thermal conductivity, thermal resistance can be reduced in the portion provided with the projected section 9B as compared with a portion joined via the solder layer 10. The projected section 9B having such a function is referred to as a thermal resistance reducing section.

Heat generated in the diode chip 4 is transmitted to the projected section 9B of the lower surface electrode layer 12 via the upper surface electrode layer 11 and the insulating substrate 2 in a vertical direction of the substrate, and transmitted to the aluminum layer 81 via the projected section 9B having a high thermal conductivity, to be discharged outside.

Since the projected section 9B of the lower surface electrode layer 12 on the insulating substrate 2 is inserted into the concave section CP1 of the base plate 1C, even when solder enters into the gap between the concave section CP1 and the projected section 9B of the lower surface electrode layer 12B on the insulating substrate 2 at the time of the joining operation by means of the solder layer 10, the solder does not flow to the lower main surface side of the base plate 1C, thus causing no problem.

For this reason, it is not necessary to set the size tolerance so as not to form a gap between the concave section CP1 and the projected section 9B, and even when the size tolerance is set between the concave section CP1 and the projected section 9B so as to form a gap for allowing smooth engagement, it is not necessary to adopt a configuration to prevent solder from flowing out to the lower main surface side of the base plate 1C, thus leading to an advantage that the manufacturing process can be simplified.

In addition, although it was described above that the projected section 9B has a thickness being a sum of the thickness of the solder layer 10 and the half of the thickness of the base plate 1C, and the concave section CP1 has a depth reaching the half of the thickness of the base plate 1C, the present invention is not limited thereto.

For example, the thickness of the projected section 9B may be set to 30 to 70% of the thickness of the base plate 1C, and the depth of the concave section CP1 may also be set to 30 to 70% of the thickness of the base plate 1C.

It is to be noted that as for a manufacturing method for the base plate 1C, first, the SiC preform 6 is prepared where a portion provided with the concave section CP1 serves as a through hole TH2. Then, aluminum impregnation is performed to fill the through hole TH2 with aluminum. Thereafter, the concave section CP1 is provided by mechanical processing or the like on the upper main surface side of the through hole TH2 fully filled with aluminum, to obtain the base plate 1C.

Fourth Preferred Embodiment

Figure 8:
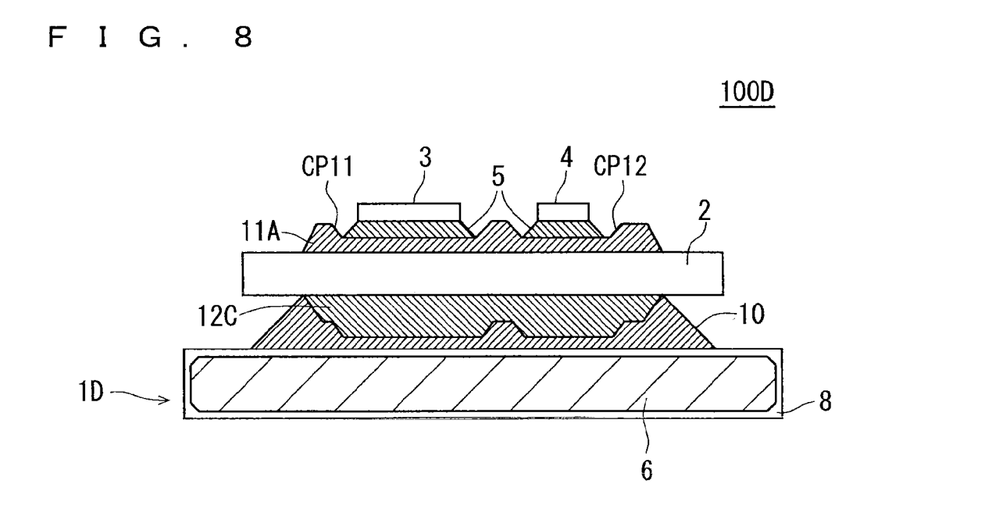
FIG. 8 is a sectional view showing a configuration of a power semiconductor device module in a fourth preferred embodiment according to the present invention.

A fourth preferred embodiment of the power semiconductor device module according to the present invention will be described with reference to FIG. 8. FIG. 8 is a sectional view showing a configuration of a power semiconductor device module 100D in the fourth preferred embodiment. It is to be noted that the same configuration as the power semiconductor device module 100 shown in FIG. 1 is provided with the same reference numeral, and a description thereof will not be repeated. Further, in FIG. 8, only a base plate 1D and the insulating substrate 2 are shown, and illustration of a configuration of the case CS and the like which are not closely related to the invention will be omitted.

The base plate 1D is a base plate having a conventional structure formed of the metal matrix composite made of aluminum and ceramic, such as Al—SiC, but in an upper surface electrode layer 11A on an insulating substrate 2A, portions corresponding to places immediately below the IGBT chip 3 and the diode chip 4 respectively serve as concave sections CP11 and CP 12, which have larger thicknesses than the other portion.

Herein, plane shapes of the concave sections CP11 and CP 12 may be rectangular shapes conformed to the plane shapes of the IGBT chip 3 and the diode chip 4, or may be circular shapes or elliptical shapes. Further, plane sizes thereof are formed to be the same level as or larger than the plane sizes of the IGBT chip 3 and the diode chip 4, respectively.

Moreover, in the lower surface electrode layer 12C, the thicknesses of the portions corresponding to the places immediately below the diode chip 4 and the IGBT chip 3 are larger the thickness of the other portion.

With such a configuration, it is possible to make small the thickness of the solder layer 10 in the portions corresponding to the places immediately below the IGBT chip 3 and the diode chip 4, and by making small the thickness of the solder layer 10 having a small thermal conductivity, the thermal resistance is reduced in the positions corresponding to the places immediately below the IGBT chip 3 and the diode chip 4 as compared with the other portion.

In the power semiconductor device module 100D as thus configured, the heat dissipation effect of heat generated at the time of operation of the IGBT chip 3 and the diode chip 4 is enhanced, whereby it is possible to reduce thermal stress, generated due to the temperature change, on each component inside the module, while preventing a temperature rise of the chip, so as to suppress shortening of a product life.

Further, since a base plate having a conventional structure can be used as a base plate 1D in the power semiconductor device module 100D, it is possible to suppress an increase in manufacturing cost.

Herein, since the thicknesses of the portions corresponding to the places immediately below the diode chip 4 and the IGBT chip 3 of the upper surface electrode layer 11A are made small and the thickness of the lower surface electrode layer 12C is made large, although a total thickness of the upper surface electrode layer 11A and the lower surface electrode layer 12C is not so small, the thickness of the solder layer 10 is small and it is thus possible to obtain the effect of reducing the thermal resistance.

It is to be noted that, although making the thickness of the solder layer 10 totally small can give the effect of further reducing the thermal resistance, cracking may occur in the solder layer 10 in this case due to thermal stress generated by a temperature cycle. For this reason, only the thicknesses of the portions corresponding to the places immediately below the diode chip 4 and the IGBT chip 3 are made small, and the thickness of the peripheral portion is held.

In order to hold the thickness of the peripheral portion, the space between the lower main surface of the insulating substrate 2 and the upper main surface of the base plate 1D cannot be narrowed, and consequently, the thickness of the lower surface electrode layer 12C is made larger, to form a configuration in which only the thicknesses of the solder layer 10 in the portions corresponding to the places immediately below the diode chip 4 and the IGBT chip 3 are made small.

It should be noted that the solder layer 10 in the portions corresponding to the places immediately below the diode chip 4 and the IGBT chip 3 normally have a thickness of 200 to 300

μm, and for obtaining the effect of reducing the thermal resistance, the thickness is made smaller than 200 μm, e.g., 20 to 150 μm.

Further, although the example was described above where the base plate 1D is formed of the metal matrix composite made of aluminum and ceramic such as Al—SiC, the material for the base plate 1D is not limited thereto, and the present invention is also effective to the case where the material is made of, for example, alumina ceramic, and the like.

Fifth Preferred Embodiment

Figure 9:
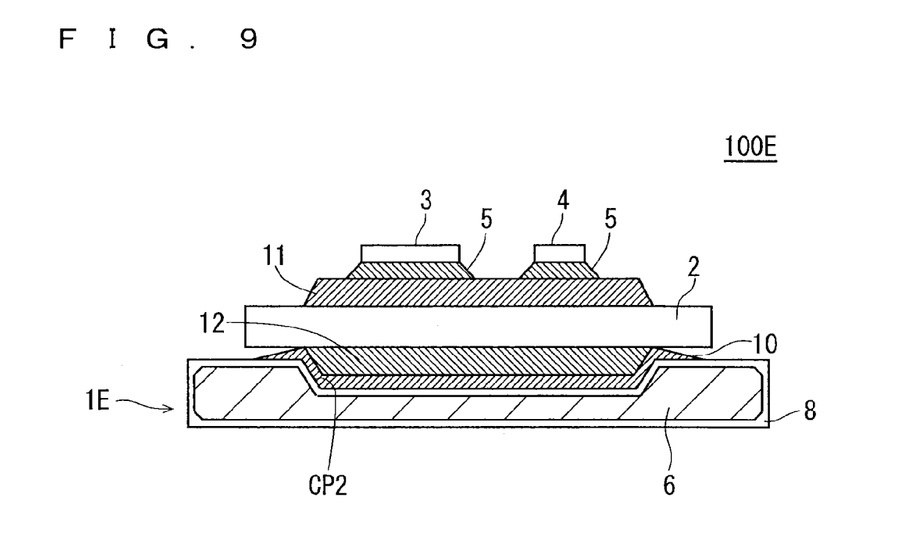
FIG. 9 is a sectional view showing a configuration of a power semiconductor device module in a fifth preferred embodiment according to the present invention.

A fifth preferred embodiment of the power semiconductor device module according to the present invention will be described with reference to FIG. 9. FIG. 9 is a sectional view showing a configuration of a power semiconductor device module 100E in the fifth preferred embodiment. It is to be noted that the same configuration as the power semiconductor device module 100 shown in FIG. 1 is provided with the same reference numeral, and a description thereof will not be repeated. Further, in FIG. 9, only a base plate 1E and the insulating substrate 2 are shown, and illustration of a configuration of the case CS and the like which are not closely related to the invention will be omitted.

The base plate 1E is formed of the metal matrix composite made of aluminum and ceramic, such as Al—SiC, and a concave section CP2 is provided in a position corresponding to a place immediately below the lower surface electrode layer 12 on the insulating substrate 2.

The insulating substrate 2 has a configuration in which the lower surface electrode layer 12 is mounted on the base plate 1E so as to be inserted into the concave section CP2, and joined to the upper main surface of the base plate 1E via the solder layer 10.

Providing the concave section CP2 in the base plate 1E can make small the thickness of the base plate 1E in the position corresponding to the place immediately below the lower surface electrode layer 12. For this reason, thermal resistance of this portion is reduced. The portion of the base plate 1E, whose thickness has been made thin and which has the function as thus described, is referred to as a thermal resistance reducing section.

In the power semiconductor device module 100E as thus configured, the heat dissipation effect of heat generated at the time of operation of the IGBT chip 3 and the diode chip 4 is enhanced, whereby it is possible to reduce thermal stress, generated due to the temperature change, on each component inside the module, while preventing a temperature rise of the chip, so as to suppress shortening of a product life.

Further, the power semiconductor device module 100E also has an advantage of facilitating positioning of the insulating substrate 2 with respect to the base plate 1E since the base plate 1E has the concave section CP2.

Moreover, since the thickness of the solder layer 10 that joins the lower surface electrode layer 12 on the insulating substrate 2 with the concave section CP2 of the base plate 1E is small as compared with the solder layers 10 of the power semiconductor device modules 100 to 100C described in the first to third preferred embodiments, it is possible to obtain the effect of reducing the thermal resistance which is exerted due to reduction in thickness of the solder layer 10.

Furthermore, since the solder layer 10 located therebetween does not have a plane shape but has a shape with a step since the lower surface electrode layer 12 is inserted into the concave section CP2 of the base plate 1E, even when cracking occurs from the end edge of the solder layer 10 due to thermal stress generated by a temperature cycle, linear advancement of the cracking is suppressed due to the presence of the step section, so as to suppress shortening of a product life.

Herein, a plane shape of the concave section CP2 provided in the base plate 1E may be a rectangular shape conformed to the plane shape of the lower surface electrode layer 12 on the insulating substrate 2, or may be a circular shape or an elliptical shape. Further, a plane size thereof is formed to be the same level as or larger than the plane size of the lower surface electrode layer 12.

It is to be noted that how much the thickness of the base plate 1E is made thin by provision of the concave section CP2 is decided considering "twist" or "warpage" due to thermal stress, and for example, a depth of the concave section CP2 is decided so as to be 20 to 30% as large as the original thickness of the base plate 1E.

Further, although the example was described above where the base plate 1E is formed of the metal matrix composite made of aluminum and ceramic such as Al—SiC, the material for the base plate 1E is not limited thereto, and the present invention is also effective to the case where the material is made of, for example, alumina ceramic, and the like.

Sixth Preferred Embodiment

Figure 10:
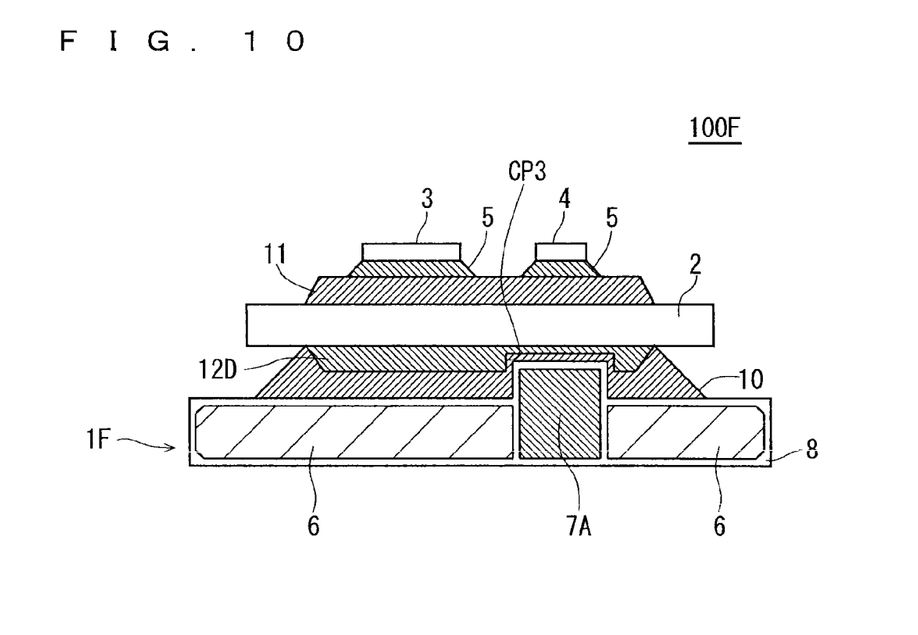
FIG. 10 is a sectional view showing a configuration of a power semiconductor device module in a sixth preferred embodiment according to the present invention.

A sixth preferred embodiment of the power semiconductor device module according to the present invention will be described with reference to FIG. 10. FIG. 10 is a sectional view showing a configuration of a power semiconductor device module 100F in the sixth preferred embodiment. It is to be noted that the same configuration as the power semiconductor device module 100 shown in FIG. 1 is provided with the same reference numeral, and a description thereof will not be repeated. Further, in FIG. 10, only a base plate 1F and the insulating substrate 2 are shown, and illustration of a configuration of the case CS and the like which are not closely related to the invention will be omitted.

In the base plate 1F shown in FIG. 10, a thermal conduction block 7A formed of a metal material having a higher thermal conductivity than that of the SiC preform 6, such as aluminum or copper, is embedded in a position corresponding to a place immediately below the diode chip 4 mounted on the insulating substrate 2 such that part of the thermal conduction block 7A vertically protrudes from the upper main surface of the base plate 1F. It should be noted that one end surface of the thermal conduction block 7A vertically protrudes from the upper main surface of the base plate 1, and the other end surface forms the same plane as the lower main surface of the base plate 1F.

Further, a concave section CP3 is provided in a portion corresponding to a place immediately below the diode chip 4 in the lower surface electrode layer 12D on the insulating substrate 2, and this part has a small thickness.

The other end surface of the thermal conduction block 7A has a thickness reaching a height being a sum of the thickness of the solder layer 10 and a depth of the concave section CP3 of the lower surface electrode layer 12D. Mounting an insulating substrate 2D on the base plate 1F such that a protruding portion of the thermal conduction block 7A is inserted into the concave section CP3 and joining them by means of the solder layer 10 makes a joint section, formed by means of the solder layer 10 in the portion corresponding to the place immediately below the diode chip 4, have an extremely small thickness.

That is, when the insulating substrate 2D is mounted on the base plate 1F and joined by means of the solder layer 10 as described above, the solder member is arranged on the upper main surface side of the base plate 1F and the base plate 1F is heated to melt the solder member. Then, the insulating substrate 2D is mounted on the base plate 1F such that the protruding portion of the thermal conduction block 7A is inserted into the concave section CP3, whereby the melted solder member expands between the lower surface electrode layer 12D on the insulating substrate 2D and the upper main surface of the base plate 1F, and the insulating substrate 2D is joined onto the base plate 1F. At this time, the melted solder also enters between the bottom surface of the concave section CP3 and the other end surface of the thermal conduction block 7A, to form a thin solder layer.

With the thermal conduction block 7A having a higher thermal conductivity than the SiC preform 6, thermal resistance of the portion corresponding to the place immediately below the diode chip 4 is reduced as compared with a configuration without the thermal conduction block 7A. The thermal conduction block 7A having such a function is referred to as a thermal resistance reducing section.

Further, in the portion corresponding to the place immediately below the diode chip 4, the joint section formed by means of the solder layer 10 becomes extremely small, while the thickness of the lower surface electrode layer 12D becomes small, so as to further reduce thermal resistance.

Further, the thickness of the lower surface electrode layer 12D and the thickness of the solder layer 10 in the portion corresponding to the place immediately below the diode chip 4 can both be set on the order of 50 μm.

Heat generated in the diode chip 4 is transmitted to the thermal conduction block 7A via the upper surface electrode layer 11, the insulating substrate 2, the thin lower surface electrode layer 12D, and the solder layer 10 in a vertical direction of the substrate, and is discharged outside via the thermal conduction block 7A having a high thermal conductivity.

In the power semiconductor device module 100F as thus configured, the heat dissipation effect of heat generated at the time of operation of the diode chip 4 is enhanced, whereby it is possible to reduce thermal stress, generated due to the temperature change, on each component inside the module, while preventing a temperature rise of the chip, so as to suppress shortening of a product life.

It is to be noted that a manufacturing method for the base plate 1F is the same as the manufacturing method for the base plate 1 described with reference to FIGS. 2 and 3, in which the SiC preform 6 is prepared where a portion inserted with the thermal conduction block 7A serves as a through hole, and a metal block constituting the thermal conduction block 7A is inserted into the through hole. At this time, the thickness of the thermal conduction block 7A is set such that the other end surface of the metal block inserted into the through hole has a thickness reaching a height being a sum of the thickness of the solder layer 10 and a depth of the concave section CP3 of the lower surface electrode layer 12D.

It is to be noted that, since the metal block is also covered by an aluminum layer by the aluminum impregnating operation, a height of the metal block is set considering the thickness of the aluminum layer.

Further, the thickness of the thermal conduction block 7A is set as described above because, when the space between the upper main surface of the base plate 1F and the bottom surface of the lower surface electrode layer 12D becomes wide as compared with the case without the thermal conduction block 7A, the thickness of the solder layer 10 totally becomes large, thereby decreasing the effect of reducing the thermal resistance.

Further, although the example was described above where the base plate 1F is formed of the metal matrix composite made of aluminum and ceramic such as Al—SiC, the material for the base plate 1F is not limited thereto, and the present invention is also effective to the case where the material is made of, for example, alumina ceramic, and the like.

Modified Example

Figure 11:
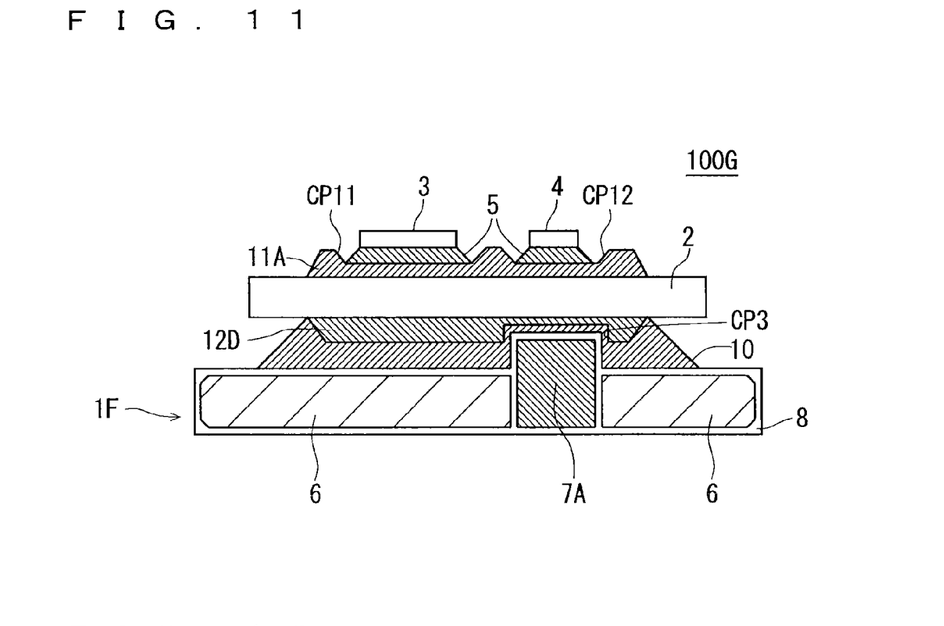
FIG. 11 is a sectional view showing a configuration of a modified example of the power semiconductor device module in the sixth preferred embodiment according to the present invention.

As described above, the power semiconductor device module 100F of the sixth preferred embodiment has the configuration in which the thickness of the lower surface electrode layer 12D in the portion corresponding to the place immediately below the diode chip 4 is made small. However, the configuration as shown in FIG. 11 may also be adopted.

That is, in a power semiconductor device module 100G shown in FIG. 11, in an upper surface electrode layer 11A on the insulating substrate 2, portions corresponding to places immediately below the IGBT chip 3 and the diode chip 4 respectively serve as concave sections CP11 and CP 12, which have smaller thicknesses than the other portion.

Herein, plane shapes of the concave sections CP11 and CP 12 may be rectangular shapes conformed to the plane shapes of the IGBT chip 3 and the diode chip 4, or may be circular shapes or elliptical shapes. Further, plane sizes thereof are formed to be the same level as or larger than the plane sizes of the IGBT chip 3 and the diode chip 4, respectively.

With such a configuration, the thermal resistance is further reduced in the positions corresponding to the places immediately below the diode chip 4 and the IGBT chip 3 as compared with the other portion.

Seventh Preferred Embodiment

Figure 12:
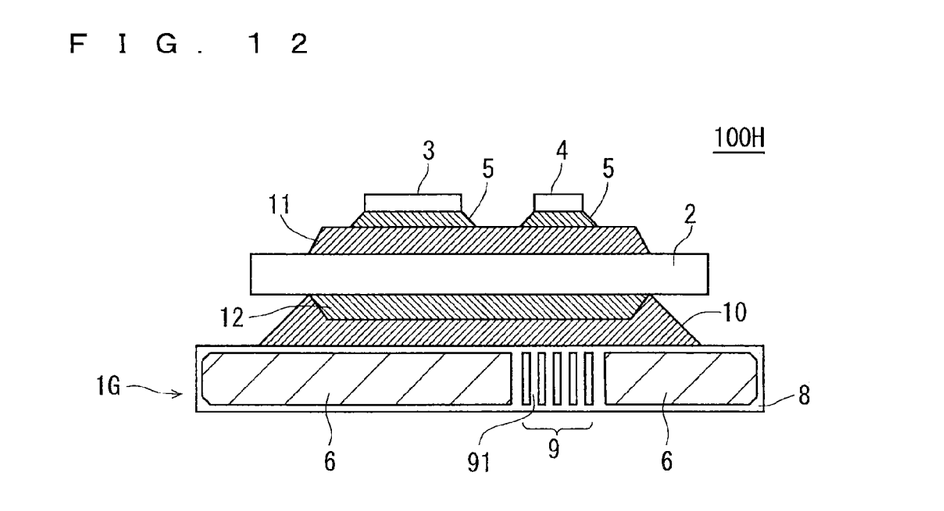
FIG. 12 is a sectional view showing a configuration of the power semiconductor device module in a seventh preferred embodiment according to the present invention.

A seventh preferred embodiment of the power semiconductor device module according to the present invention will be described with reference to FIGS. 12 and 13. FIG. 12 is a sectional view showing a configuration of a power semiconductor device module 100H in the seventh preferred embodiment. It is to be noted that the same configuration as the power semiconductor device module 100 shown in FIG. 1 is provided with the same reference numeral, and a description thereof will not be repeated. Further, in FIG. 12, only a base plate 1G and the insulating substrate 2 are shown, and illustration of a configuration of the case CS and the like which are not closely related to the invention will be omitted.

The base plate 1G shown in FIG. 12 has a metal filling area 9 in matrix shape in a position corresponding to the place immediately below the diode chip 4 mounted on the insulating substrate 2. FIG. 13 shows a plan view of the base plate 1G.

Figure 13:
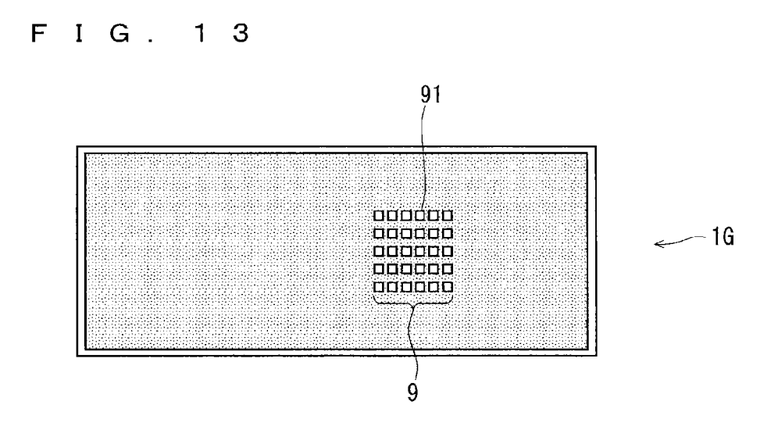
FIG. 13 is a plan view of a base plate of the power semiconductor device module in the seventh preferred embodiment according to the present invention.

As shown in FIG. 13, the metal filling area 9 has a plurality of through filling sections 91 provided spaced apart from one another so as to penetrate the SiC preform 6 in a vertical direction, and the plurality of through filling sections 91 are arranged in a vertical and horizontal manner to form a matrix shape.

The through filling section 91 is configured by filling of the inside of the through section, whose opening has a circular shape, a rectangular shape, or some other shape, with a metal material having a high thermal conductivity, such as aluminum. For example, when the plane shape of the through filling section 91 is a circular shape, a diameter thereof is set to the order of 1 mm and an interval between adjacent through filling sections 91 is set to the order of 1 mm, as minimum values. These are values in consideration of mechanical strength and flowability of aluminum.

The metal filling area 9 with such a configuration is set in the position corresponding to the place immediately below the diode chip 4, thus leading to reduction in thermal resistance in the portion corresponding to the place immediately below the diode chip 4 as compared with a configuration without the metal filling area 9. The metal filling area 9 having such a function is referred to as a thermal resistance reducing section.

Heat generated in the diode chip 4 is transmitted to the metal filling area 9 via the upper surface electrode layer 11, the insulating substrate 2, the lower surface electrode layer 12, and the solder layer 10 in a vertical direction of the substrate, and is discharged outside via the through filling sections 91 filled with aluminum having a high thermal conductivity.

In the power semiconductor device module 100H as thus configured, the heat dissipation effect of heat generated at the time of operation of the diode chip 4 is enhanced, whereby it is possible to reduce thermal stress, generated due to the temperature change, on each component inside the module, while preventing a temperature rise of the chip, so as to suppress shortening of a product life.

It is to be noted that as for a manufacturing method for the base plate 1G, the SiC preform 6 in which a portion formed with the through filling sections 91 serves as a through hole is prepared, and the SiC preform 6 is impregnated with aluminum, to obtain the metal filling area 9 in which the inside of the through hole is filled with aluminum, and the through filling sections 91 are arranged in matrix shape.

In addition, the through holes for forming the through filling sections 91 may be formed simultaneously at the time of molding of the SiC preform 6, or may be formed such that a SiC preform 6 in the state without a through hole is molded and then subjected to mechanical processing.

Further, the through filling sections 91 may be arranged in a shape other than the matrix shape, and for example, it may be arranged in a concentric shape or in a zig-zag shape.

Moreover, the through section to be provided with the through filling sections 91 may be not holes but may be slits. The metal filling area 9 may be formed by arranging a plurality of slits in parallel and filling them with aluminum.

Furthermore, although the example was shown above where the through filling sections 91 are filled with aluminum since the base plate 1G is formed while the SiC preform 6 is impregnated with aluminum, when the base plate 1G is configured without impregnation of aluminum, e.g., alumina ceramic, the metal material to fill the through filling sections 91 is not limited to aluminum, but may be copper, for example, or may be another metal material having a high thermal conductivity.

As thus described, the power semiconductor device module 100H does not require a particular material for the base plate 1G, but can be manufactured in the same manufacturing method as the conventional method, whereby it is possible to suppress an increase in manufacturing cost.

Although the examples were shown in the first to third, sixth, and seventh preferred embodiments described above in which the configuration for reducing thermal resistance (thermal resistance reducing section) is provided in the portion corresponding to the place immediately below the diode chip 4, this example is based on the assumption that the diode chip 4 is the SiC semiconductor chip, and when the IGBT chip 3 is also the SiC semiconductor chip, it goes without saying that the configuration for reducing thermal resistance is also provided in the portion corresponding to the place immediately below the IGBT chip 3.

Further, as described in the fourth preferred embodiment with reference to FIG. 8, in the first to third, fifth, and seventh preferred embodiments, such a configuration may be adopted in which concave sections are respectively formed in portions, of the upper surface electrode layer on the insulating substrate, corresponding to places immediately below the IGBT chip 3 and the diode chip 4, and thicknesses of the upper surface electrode layer of these portions have smaller thicknesses than the other portion. The thickness of the upper surface electrode layer is made further smaller, so as to obtain the effect of further reducing thermal resistance.

Further, the present invention is effective even when the IGBT chip 3 and the diode chip 4 are not SiC semiconductor chips but silicon semiconductor chips, and the present invention is also effective to a semiconductor chip using a wide band gap semiconductor other than SiC.

Examples of the other wide band gap semiconductors include a gallium nitride-based material, an aluminum nitride-based material, diamond, and the like.

Since a switching device and a diode configured using such a wide band gap semiconductor as the substrate material has high voltage resistance and a high allowable current density, they can be reduced in size as compared with the silicon semiconductor device, and by use of the switching device and the diode which are reduced in size, a semiconductor device module incorporated with these devices can be reduced in size.

Further, since such a switching device and diode have high heat resistance, a radiating fin of a heat sink can be reduced in size and cooling can be performed not by means of water but by means of air, and hence the semiconductor device module can be further reduced in size.

Moreover, in the case of mounting a MOS transistor chip of SiC in place of the IGBT chip 3, a similar effect can be obtained by providing a configuration for reducing thermal resistance in a portion corresponding to a place immediately below the MOS transistor chip.

It is to be noted that, in the present invention, each preferred embodiment can be combined without restriction and can be modified and omitted as appropriate within the scope of the invention.

What is claimed is:

1. A power semiconductor device module, comprising:
a base plate;
an insulating substrate mounted on said base plate; and
a power semiconductor device mounted on said insulating substrate,
said device module being obtained by modularizing said base plate, said insulating substrate, and a power semiconductor device, wherein
said insulating substrate has a first electrode layer disposed on a first main surface and a second electrode layer disposed on a second main surface,
said power semiconductor device is joined onto said first electrode layer,
said second electrode layer is joined onto a first main surface of said base plate, and
a thermal resistance reducing section that reduces thermal resistance is provided in said second electrode layer or said base plate of a portion corresponding to a place immediately below the power semiconductor device.

2. The power semiconductor device module according to claim 1, wherein said thermal resistance reducing section is formed of a metal thermal conduction block embedded in a portion of said base plate corresponding to a place immediately below said power semiconductor device.

3. The power semiconductor device module according to claim 2, wherein said first electrode layer has a concave section in the portion corresponding to the place immediately below said power semiconductor device.

4. The power semiconductor device module according to claim 1, wherein
said thermal resistance reducing section is formed of a metal thermal conduction block embedded in a portion of said base plate corresponding to a place immediately below said power semiconductor device such that part thereof vertically protrudes from said first main surface of said base plate,
said second electrode layer has a concave section provided in the portion corresponding to the place immediately below said power semiconductor device, and
said insulating substrate is mounted on said base plate such that a protruding portion of said thermal conduction block is inserted into said concave section.

5. The power semiconductor device module according to claim 4, wherein one end surface of said thermal conduction block has a thickness reaching a height being a sum of a depth of said concave section and a thickness of a solder layer that joins said second electrode layer with the first main surface of said base plate when the other end surface of said thermal conduction block forms the same plane as the second main surface of said base plate.

6. The power semiconductor device module according to claim 4, wherein said first electrode layer has a concave section in the portion corresponding to the place immediately below said power semiconductor device.

7. The power semiconductor device module according to claim 1, wherein
said base plate is formed of a metal matrix composite obtained by impregnating a SiC porous molded body with aluminum,
said thermal resistance reducing section is an aluminum layer provided in the portion of said base plate corresponding to the place immediately below said power semiconductor device, and
said aluminum layer is formed by fully filling a concave section, provided in said SiC porous molded body, with aluminum in a formation step for said base plate.

8. The power semiconductor device module according to claim 7, wherein said concave section is provided in each main surface of said SiC porous molded body.

9. The power semiconductor device module according to claim 7, wherein said first electrode layer has a concave section in the portion corresponding to the place immediately below said power semiconductor device.

10. The power semiconductor device module according to claim 1, wherein
said thermal resistance reducing section is formed of a projected section provided so as to vertically protrude from a portion of said second electrode layer corresponding to a place immediately below said power semiconductor device,
said base plate has a through hole provided in the portion corresponding to the place immediately below said power semiconductor device, and
said insulating substrate is mounted on said base plate such that said projected section is inserted into said through hole.

11. The power semiconductor device module according to claim 10, wherein said projected section has a height being a sum of a thickness of said base plate and a thickness of a solder layer that joins said second electrode layer with the first main surface of said base plate such that the end surface thereof forms the same plane as said second main surface when said projected section is inserted into said through hole of said base plate.

12. The power semiconductor device module according to claim 10, wherein said first electrode layer has a concave section in the portion corresponding to the place immediately below said power semiconductor device.

13. The power semiconductor device module according to claim 1, wherein
said thermal resistance reducing section is formed of
a projected section provided so as to vertically protrude from a portion corresponding to a place immediately below said power semiconductor device on said second electrode layer, and
an aluminum layer constituting a bottom of a concave section provided in a portion of said base plate corresponding to a place immediately below said power semiconductor device, and
said insulating substrate is mounted on said base plate such that said projected section is inserted into said concave section.

14. The power semiconductor device module according to claim 13, wherein said projected section has a height being a sum of a depth of said concave section and a thickness of a solder layer that joins said second electrode layer with the first main surface of said base plate such that the end surface thereof come into contact with a bottom surface when said projected section is inserted into said concave section of said base plate.

15. The power semiconductor device module according to claim 13, wherein said first electrode layer has a concave section in the portion corresponding to the place immediately below said power semiconductor device.

16. The power semiconductor device module according to claim 1, wherein
said thermal resistance reducing section is formed of a metal filling area arranged in a portion of said base plate corresponding to a place immediately below said power semiconductor device, and
said metal filling area has a plurality of through filling sections which are provided so as to penetrate said base plate in a vertical direction, and in which insides of through holes arranged spaced apart from one another are filled with metal.

17. The power semiconductor device module according to claim 16, wherein said first electrode layer has a concave section in the portion corresponding to the place immediately below said power semiconductor device.

18. The power semiconductor device module according to claim 1, wherein
said base plate has a concave section provided in a position corresponding to a place immediately below said second electrode layer on said insulating substrate,
said concave section is set to have a size capable for housing said second electrode layer, and
said thermal resistance reducing section is configured by a portion of said base plate constituting a bottom of said concave section, whose thickness has been made small.

19. The power semiconductor device module according to claim 18, wherein said first electrode layer has a concave section in the portion corresponding to the place immediately below said power semiconductor device.

* * * * *